United States Patent [19]

Gribkov et al.

[11] Patent Number: 5,688,320
[45] Date of Patent: Nov. 18, 1997

[54] PROCESS FOR MANUFACTURING ALUMINUM NITRIDE WHISKERS

[75] Inventors: Vladimir Nikolaevich Gribkov; Boris Vladimirovitch Shchetanov; Eric Loguinovitch Umantsev, all of Moscow; Vladimir Alexandrovich Silaev, Tverskaja Obl.; Yurii Alexeevich Gorelov, Tverskaja Obl.; Piotr Phiodorovich Lyasota, Tverskaja Obl., all of Russian Federation

[73] Assignees: Societe Nationale Industrielle et Aerospatiale, Paris, France; VIAM-ALL Russian Institut of Aviation Materials, Moscow, Russian Federation

[21] Appl. No.: 665,368

[22] Filed: Jun. 17, 1996

[30] Foreign Application Priority Data

Jun. 19, 1995 [FR] France .................. 95 07278

[51] Int. Cl.$^6$ .................................................. C30B 9/00
[52] U.S. Cl. ........................ 117/75; 117/87; 117/921; 117/950
[58] Field of Search ........................ 117/75, 87, 205, 117/921, 950; 423/412

[56] References Cited

U.S. PATENT DOCUMENTS

| | | | |
|---|---|---|---|
| 3,598,526 | 8/1971 | Huml et al. | 117/87 |
| 4,806,198 | 2/1989 | Jagota et al. | 117/921 |
| 4,917,877 | 4/1990 | Oguni et al. | 423/412 |
| 5,190,738 | 3/1993 | Parent | 423/412 |
| 5,246,683 | 9/1993 | Parent et al. | 423/412 |

FOREIGN PATENT DOCUMENTS

| | | | |
|---|---|---|---|
| 0176737 | 4/1986 | European Pat. Off. . | |
| 0284222 | 9/1988 | European Pat. Off. . | |
| 427109 | 7/1911 | France . | |
| 3187998A | 8/1991 | Japan | 117/87 |

OTHER PUBLICATIONS

Katsutoshi Komeya et al, "Synthesis of AlN Powder by Carbothermal Reduction–Nitridation Method", International Edition 101 (1993) Apr., No. 4.

*Primary Examiner*—Felisa Garrett
*Attorney, Agent, or Firm*—Burns, Doane, Swecker & Mathis, L.L.P.

[57] ABSTRACT

Aluminum nitride whiskers are produced by reducing alumina with carbon in a nitrogen atmosphere, at a temperature of 1800° to 2000° C., in the presence of a growth activator containing a solvent element, according to a process that essentially comprises the step of periodically feeding, through the working area of a horizontal furnace equipped with a graphite heating device, counter to a flow of nitrogen, a graphite container charged with a mixture of alumina, carbon and carbonyl iron, as a growth activator, which is present in an amount capable of implementing the VLS mechanism, the time taken by the container to pass through the working zone being in the range of 20 to 120 minutes.

4 Claims, No Drawings

PROCESS FOR MANUFACTURING ALUMINUM NITRIDE WHISKERS

FIELD THE INVENTION

The invention relates to a process for the manufacture of aluminum nitride whiskers which can be used in metallic or polymeric composites, structural ceramics, heat insulating materials, etc.

Whiskers are to be taken here as meaning practically flawless filiform monocrystals which are generally 1 to 50 µm in diameter and have lengths that may range from several µm to several cm.

BACKGROUND OF THE INVENTION

By contrast with other ceramic compounds, aluminum nitride whiskers offer a highly advantageous combination of high thermal conductivity and excellent dielectric properties. They also have piezoelectric characteristics that are superior by far to those of conventional piezoelectric quartz types. For these different reasons, aluminum nitride whiskers are now very promising for the production of heat conducting and, in particular, heat resistant, ceramics, transmission apparatus whose operation is based on the piezoelectric effect, etc.

However, unlike what is observed in the production of silicon carbide whiskers, no intensive research has been conducted into processes for the production of aluminum nitride whiskers and they have not, hitherto, been used in industry.

Various types of processes for manufacturing these whiskers are known, namely:
gas phase deposition using aluminum nitriding reactions:

$$2Al + N_2 \longrightarrow 2AlN ;$$
$$(gas) \qquad (solid)$$

sublimation-condensation of aluminum nitride with a temperature gradient:

$$AlN \xrightarrow{T_1} Al + N \xrightarrow{T_2} AlN \text{ with } T_1 > T_2;$$
$$(solid) \qquad (solid) \ (gas) \qquad (solid)$$

reduction of aluminum chlorides or bromides in a hydrogen and ammonia atmosphere:

$$AlCl_3 + NH_3 \longrightarrow AlN + 3HCl; \text{ and}$$
$$(solid)$$

reduction of alumina with carbon, in a nitrogen atmosphere, using the reaction:

$$Al_2O_3 + 3C + N_2 \rightarrow 2AlN + 3CO.$$

When any one of these reactions is used, it is necessary, in order for the aluminum nitride to condense in the form of whiskers, that solvent elements be present, in the form of impurities, in the condensation zone. These solvents have to ensure the operation of the VLS (vapor—liquid—solid) mechanism.

It is known to use, for example, the following elements as solvents of this type: silicon, molybdenum, iron, nickel, etc.

When only a small amount of aluminum nitride whiskers is required, the easiest process is used, i.e. aluminum nitriding. However, in this process, the product is inevitably contaminated by free aluminum and inevitably loses the requisite dielectric characteristics. In addition, as the process necessitates high temperatures (1600° C. to 2000° C.), it is necessary, as a rule, to use graphite heaters and tooling. Their interaction with aluminum leads to the formation of aluminum carbide, which destroys the graphite members through hydrolysis when they come into contact with the moisture of the air. That is why such a process is not applicable to industrial practice.

The aluminum nitride sublimation-condensation process permits the production of high quality whiskers, but this process is probably not used on a large scale owing to the high cost of the starting material and the great difficulty experienced in designing equipment of high productivity.

Furthermore, it is impossible to use the chloride method in a nitrogen atmosphere and the need for the presence of ammonia gives rise to numerous problems with industrial equipment owing to the fact that solid $NH_4Cl$ condensates appear on the walls of the chambers, tubes and accessories. Moreover, this process is toxic.

That is why the most advantageous process for the industrial production of aluminum nitride whiskers is the one in which the following reaction is used:

$$Al_2O_3 + 3C + N_2 \rightarrow 2AlN + 3CO.$$

The advantages of this process are as follows:

1) the variety of forms, simplicity and low cost of the starting materials;

2) the fact that there is no need for a temperature gradient in the reaction zone, which is why it is now possible to use an entire range of industrial furnaces, including those with large overall dimensions;

3) the ease with which the activating elements are introduced into the reaction zone together with the charge;

4) a sufficiently wide range of temperature (1600°–2050° C.) and reaction time, which makes it possible to choose the optimum program for condensing the nitride in the form of whiskers.

However, even this process (as described and discussed hereinabove) has not been sufficiently mastered hitherto for use in industrial production.

Unlike silicon carbide, aluminum nitride has the advantageous feature of having many different forms of growth. Of the known crystallographic orientations, namely: <0001>, <10$\bar{1}$0>, <1201>, <10$\bar{1}$1> and <2$\bar{4}$23>, those whiskers that only have the <0001> orientation are of an acceptable cross-sectional shape (hexagonal or nearly circular) for use in composites, and have sufficiently high strength, which can be as much as approximately 7000 to 8000 MPa (700 to 800 kgf/mm$^2$). Such whiskers also have a maximum piezoelectric effect.

Consequently, the process applicable in practice for producing aluminum nitride whiskers must ensure preferential growth of whiskers with precisely such crystallographic orientation.

SUMMARY OF THE INVENTION

The object of the present invention is thus to develop an industrial process for the manufacture of aluminum nitride whiskers, which process makes it possible:

to use equipment that is sufficiently simple and reliable for growing the said whiskers;

to produce whiskers having a strength of at least approximately 5000 to 7000 MPa (500 to 700 kgf/mm$^2$);

to obtain the highest productivity and good economic efficiency though to the use of cheap starting materials.

These objects are achieved according to the invention, which provides a process for producing aluminum nitride whiskers by reducing alumina with carbon in a nitrogen atmosphere, at a temperature of 1800° to 2000° C. This process is carried out in a semi-continuously operating horizontal furnace equipped with a graphite heating device. Graphite containers, the charge of which is formed of a powdery mixture of alumina, carbon and a growth activator [containing the solvent element(s)] for implementation according to the VLS mechanism defined hereinabove, are fed periodically through the furnace.

According to the invention, carbonyl iron powder is used as a growth activator.

More precisely, the subject-matter of the invention is a process for producing aluminum nitride whiskers by reducing alumina with carbon in a nitrogen atmosphere, at a temperature of 1800° to 2000° C., in the presence of a growth activator containing a solvent element, characterized in that it essentially comprises the step of periodically feeding, through the working area of a horizontal furnace equipped with a graphite heating device, counter to a flow of nitrogen, a graphite container charged with a mixture of alumina, carbon and carbonyl iron, as a growth activator, which is present in an amount capable of implementing the VLS mechanism, and in that the time taken by the container to pass through the working zone is in the range of 20 to 120 minutes.

Advantageously, the carbonyl iron is used in a proportion of 0.1 to 5.0 weight % of the mixture as, in this concentration range, steady growth of aluminum nitride whiskers according to the VLS process is observed. These whiskers are of high quality and are formed with an optimum yield. If the proportion of carbonyl iron drops below 0.1 weight %, a drop in the output and in the productivity of the process, respectively, is observed. An increase in the proportion of carbonyl iron beyond 5.0 weight % leads to the growth of whiskers having flaws and contaminated with iron.

Advantageously, the carbon content of the charge is of 5 to 25 weight %. Below 5 weight %, productivity declines while, above 25 weight %, whiskers form with major flaws owing to considerable intensification of the process and over-saturation.

The graphite containers having the charge therein, and on the surface of which the whiskers grow, move through the furnace, counter to the flow of nitrogen. Otherwise, when the containers move through colder zones in the furnace, a secondary growth of side branches appears on the whiskers that have already developed, and the whiskers are contaminated by condensate.

The optimum growth time, which corresponds to the time taken by the container to pass through the working zone, and which is in the range of 20 to 120 minutes, depends on the reaction temperature. More precisely, the higher the temperature, the shorter the time taken by the container to pass through the working zone in the furnace must be, this being to prevent secondary thickening of the whiskers according to the VS (vapor-solid) mechanism and an increase in their flaws. The working zone traversal time is defined by the speed or the frequency of the forced passages of the containers.

The whisker growth process is always conducted in the range of 1800° to 2000° C. as these temperatures permit the growth of the strongest fine whiskers. It should be noted in this connection that a temperature increase up to 1950° C. increases productivity by one order of magnitude, but leads to an increase in the diameter of the whiskers and to a reduction in their mechanical strength.

The process defined hereinabove was tested and developed using industrial furnaces running semi-continuously.

According to this process, aluminum nitride whiskers were obtained having a diameter of 1 to 3 mm, a preferential (more than 95%) growth orientation <1001> and a mechanical strength that could be as much as 8000 MPa (800 kgf/mm$^2$). This process proved to offer a productivity that was acceptable for industrial use.

EXAMPLES

The purpose of the following examples is to illustrate and more precisely explain the invention.

EXAMPLE 1

To produce aluminum nitride whiskers, use was made of a semi-continuous furnace with a graphite heating device, having an inside diameter of 125 mm, an overall length of 1500 mm and a zone having a uniform maximum temperature (working zone) with a length of approximately 400 mm. Two graphite boats, each 200 mm long, placed one upon the other, were used as containers. The charge, containing 89 weight % of alumina, 10 weight % of carbon and 1 weight % of carbonyl iron with a grain size of 1 to 3 μm, was placed in each of the boats in a layer approximately 10 mm thick. The temperature in the working zone was held equal to 1850° C. The furnace was purged with nitrogen, the flow rate of which was equal to 1 m$^3$/h.

The containers were caused to move counter to the flow of nitrogen, their speed being such that their dwell time in the working area be equal to 45 minutes. In 24 hours, there were thus obtained approximately 150 g of aluminum nitride whiskers having a diameter of 1 to 3 mm. These whiskers had the preferential crystallographic growth orientation <1001> and a mechanical strength of approximately 7000 MPa (700 kgf/mm$^2$), contained practically no free aluminum as impurities and had high dielectric properties.

EXAMPLE 2

Aluminum nitride whiskers were formed in a way similar to that described in Example 1, but the temperature in the working zone was equal to 1950° C. and the container remained therein for 25 minutes. In 24 hours, there were thus obtained approximately 1 kg of whiskers having a diameter of approximately 10 mm and a mechanical strength of 5000 MPa (500 kgf/mm$^2$).

EXAMPLE 3

The whiskers were grown in a way similar to that described in Example 1, but with an amount of carbonyl iron equal to 0.3 weight % and a proportion of carbon of 5 weight %. The resulting whiskers were not different from those obtained according to example 1, but, in this example, the productivity dropped to only 100 g/day.

EXAMPLE 4

The process was similar to that described in Example 1, but the carbonyl iron content of the charge was equal to 3 weight % and the carbon content was 20 weight %. The resulting productivity of the process was 150 g/day and the mechanical resistance of the whiskers was approximately 6000 MPa (600 kgf/mm$^2$).

We claim:

1. A process for producing aluminum nitride whiskers by reducing alumina with carbon in a nitrogen atmosphere, at a temperature of 1800° to 2000° C., in the presence of a growth activator containing a solvent element, which process comprises the step of periodically feeding, through a working area of a horizontal furnace equipped with a graphite heating device, counter to a flow of nitrogen, a graphite container charged with a mixture of alumina, carbon and carbonyl iron, as the growth activator, which is present in an amount capable of implementing a VLS mechanism, and wherein the time taken by the container to pass through the working zone ranges from 20 to 120 minutes.

2. The process according to claim 1, wherein carbonyl iron is used in a proportion representing 0.1 to 5.0 weight of the mixture.

3. The process according to claim 1, wherein the carbon content of the charge is of 5 to 25 weight %.

4. A process for preparing aluminum nitride whiskers, said process comprising the step of reacting alumina with carbon in the presence of nitrogen and carbonyl iron at conditions effective to produce aluminum nitride whiskers.

* * * * *

UNITED STATES PATENT AND TRADEMARK OFFICE
CERTIFICATE OF CORRECTION

PATENT NO. : 5,688,320
DATED : November 18, 1997
INVENTOR(S) : Vladimir Nikolaevich Gribkov et al.

It is certified that error appears in the above-indentified patent and that said Letters Patent is hereby corrected as shown below:

Column 2, line 67, replace "though to" with --through--.

Claim 2, line 2, insert --%-- after "weight".

Signed and Sealed this

Eighteenth Day of August, 1998

*Attest:*

BRUCE LEHMAN

*Attesting Officer*  *Commissioner of Patents and Trademarks*